United States Patent
Guo et al.

(12)

(10) Patent No.: US 11,361,702 B2
(45) Date of Patent: Jun. 14, 2022

(54) SHIFT REGISTER UNIT AND DRIVING METHOD THEREOF, SCAN DRIVING CIRCUIT, ARRAY SUBSTRATE AND DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Hongtao Guo, Beijing (CN); Guowei Chai, Beijing (CN); Fu Tang, Beijing (CN); Bangrong Xu, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 610 days.

(21) Appl. No.: 16/335,408

(22) PCT Filed: Jul. 10, 2018

(86) PCT No.: PCT/CN2018/095121
§ 371 (c)(1),
(2) Date: Mar. 21, 2019

(87) PCT Pub. No.: WO2019/056833
PCT Pub. Date: Mar. 28, 2019

(65) Prior Publication Data
US 2021/0350738 A1    Nov. 11, 2021

(30) Foreign Application Priority Data

Sep. 25, 2017  (CN) .......................... 201710877090.6

(51) Int. Cl.
*G09G 3/20*     (2006.01)
*G11C 19/28*    (2006.01)

(52) U.S. Cl.
CPC ........... *G09G 3/2092* (2013.01); *G11C 19/28* (2013.01); *G09G 2310/0267* (2013.01); *G09G 2310/0286* (2013.01)

(58) Field of Classification Search
CPC ........... G11C 19/28; G09G 2310/0286; G09G 3/2092
See application file for complete search history.

(56) References Cited

U.S. PATENT DOCUMENTS 8,923,472 B2    12/2014  Sasaki et al.
2015/0317954 A1  11/2015  Jang
(Continued)

FOREIGN PATENT DOCUMENTS

CN    103098373 A    5/2013
CN    105047119 A    11/2015
(Continued)

OTHER PUBLICATIONS

International Search Report and Written Opinion dated Oct. 18, 2018; PCT/CN2018/095121.

*Primary Examiner* — Xuemei Zheng (57) ABSTRACT

A shift register unit and a driving method thereof, a scan driving circuit, an array substrate and a display device. The shift register unit includes: an input circuit configured for setting the first node to a valid level in a case where the input terminal is at a valid level; a first reset control circuit configured for setting the second node to a valid level and setting the input terminal to an invalid level in a case where the reset terminal is at a valid level; an output circuit configured for setting the output terminal to a valid level by using a clock signal in a case where the first node is at the valid level; a reset circuit configured for setting the first node and the output terminal to an invalid level in a case where the second node is at a valid level.

20 Claims, 7 Drawing Sheets

(56) References Cited

U.S. PATENT DOCUMENTS

| | | | |
|---|---|---|---|
| 2017/0039968 A1* | 2/2017 | Chen | ................... G09G 3/3677 |
| 2018/0137799 A9 | 5/2018 | He et al. | |
| 2018/0350315 A1* | 12/2018 | Zhang | ................. G09G 3/3677 |

FOREIGN PATENT DOCUMENTS

| | | |
|---|---|---|
| CN | 105047127 A | 11/2015 |
| CN | 107146570 A | 9/2017 |
| CN | 107154236 A | 9/2017 |
| CN | 107507553 A | 12/2017 |

* cited by examiner

SHIFT REGISTER UNIT AND DRIVING METHOD THEREOF, SCAN DRIVING CIRCUIT, ARRAY SUBSTRATE AND DISPLAY DEVICE

The present application claims priority to Chinese Patent Application No. 201710877090.6, filed on Sep. 25, 2017, the disclosure of which is incorporated herein by reference in its entirety as part of the present application.

TECHNICAL FIELD

The embodiments of the present disclosure relate to a shift register unit and a driving method thereof, a scan driving circuit, an array substrate and a display device.

BACKGROUND

Compared with traditional processes, the GOA (Gate Driver On Array) technology not only omits a circuit board for carrying a gate driver and realize a display panel having symmetrical sides, but also omits a chip bonding area on an edge of the display panel and a wiring area such as a fan-out area, which contributes to the realization of a narrow bezel. Also, the GOA technology may save the chip bonding process in a row direction, so greatly improves an overall production capacity and a yield rate.

SUMMARY

At least one embodiment of the present disclosure provides a shift register unit, comprising an input terminal, an output terminal and a reset terminal, and further comprising: an input circuit, connected with the input terminal and a first node respectively, and configured for setting the first node to a valid level in a case where the input terminal is at a valid level; an output circuit, connected with the output terminal and the first node respectively, and configured for setting the output terminal to a valid level by using a first clock signal in a case where the first node is at the valid level; a reset circuit, connected with the first node and the second node respectively, and configured for setting the first node to an invalid level in a case where the second node is at a valid level; a first reset control circuit, connected with the second node, the input terminal and the reset terminal respectively, and configured for setting the second node to the valid level and setting the input terminal to an invalid level in a case where the reset terminal is at a valid level; and a second reset control circuit, connected with the second node and the input terminal respectively, and configured for setting the second node to an invalid level in a case where the input terminal is at the valid level.

For example, in the shift register unit according to an embodiment of the present disclosure, the first reset control circuit comprises: a first conduction subcircuit, connected with the reset terminal and a third node respectively, and configured for conducting electricity between the reset terminal and the third node in a case where the reset terminal is at the valid level; a second conduction subcircuit, connected with the third node, the reset terminal and the second node respectively, and configured for conducting electricity between the reset terminal and the second node in a case where the third node is provided with the valid level at the reset terminal; and a reset subcircuit, connected with the reset terminal and the input terminal respectively, and configured for setting the input terminal to an invalid level in a case where the reset terminal is at the valid level; correspondingly, the second reset control circuit is further connected with the third node, and configured for setting the third node to an invalid level in a case where the input terminal is at the valid level.

For example, in the shift register unit according to an embodiment of the present disclosure, the first conduction subcircuit comprises a first transistor, the second conduction subcircuit comprises a second transistor, and the reset subcircuit comprises a third transistor; a gate of the first transistor is connected with the reset terminal, one of a source and a drain of the first transistor is connected with the reset terminal, and a remaining one of the source and the drain of the first transistor is connected with the third node; a gate of the second transistor is connected with the third node, one of a source and a drain of the second transistor is connected with the reset terminal, and a remaining one of the source and the drain of the second transistor is connected with the second node; a gate of the third transistor is connected with the reset terminal, one of a source and a drain of the third transistor is connected with the input terminal, and a remaining one of the source and the drain of the third transistor is connected with an invalid-level voltage line.

For example, in the shift register unit according to an embodiment of the present disclosure, the first reset control circuit further comprises a first capacitor, a first terminal of the first capacitor is connected with the second node, and a second terminal of the first capacitor is connected with the third node.

For example, in the shift register unit according to an embodiment of the present disclosure, the third node is connected with the second node.

For example, in the shift register unit according to an embodiment of the present disclosure, the second reset control circuit comprises a fourth transistor and a fifth transistor; a gate of the fourth transistor is connected with the input terminal, one of a source and a drain of the fourth transistor is connected with the second node, a remaining one of the source and the drain of the fourth transistor is connected with the invalid-level voltage line; a gate of the fifth transistor is connected with the input terminal, one of a source and a drain of the fifth transistor is connected with the third node, a remaining one of the source and the drain of the fifth transistor is connected with the invalid-level voltage line.

For example, in the shift register unit according to an embodiment of the present disclosure, wherein the reset circuit comprises a sixth transistor; a gate of the sixth transistor is connected with the second node, one of a source and a drain of the sixth transistor is connected with the first node, a remaining one of the source and the drain of the sixth transistor is connected with the invalid-level voltage line.

For example, in the shift register unit according to an embodiment of the present disclosure, the reset circuit further comprises a seventh transistor, a gate of the seventh transistor is connected with the second node, one of a source and a drain of the seventh transistor is connected with the output terminal, a remaining one of the source and the drain of the seventh transistor is connected with an invalid-level voltage line.

For example, in the shift register unit according to an embodiment of the present disclosure, the reset circuit further comprises an eighth transistor, a gate of the eighth transistor is connected with the reset terminal, one of a source and a drain of the eighth transistor is connected with the first node, a remaining one of the source and the drain of the eighth transistor is connected with a first clock signal or an invalid-level voltage line.

For example, in the shift register unit according to an embodiment of the present disclosure, the reset circuit further comprises a ninth transistor, a gate of the ninth transistor is connected with the reset terminal or the second clock signal, one of a source and a drain of the ninth transistor is connected with the output terminal, a remaining one of the source and the drain of the ninth transistor is connected with an invalid-level voltage line; the first clock signal and the second clock signal have opposite phases.

For example, in the shift register unit according to an embodiment of the present disclosure, wherein the input circuit comprises a tenth transistor, a gate of the tenth transistor is connected with the input terminal, one of a source and a drain of the tenth transistor is connected with the input terminal, a remaining one of the source and the drain of the tenth transistor is connected with the first node.

For example, in the shift register unit according to an embodiment of the present disclosure, wherein the output circuit comprises an eleventh transistor and a second capacitor; a gate of the eleventh transistor is connected with the first node, one of a source and a drain of the eleventh transistor is connected with the first clock signal, a remaining one of the source and the drain of the eleventh transistor is connected with the output terminal; a first terminal of the second capacitor is connected with the first node, and a second terminal of the second capacitor is connected with the output terminal.

At least one embodiment of the present disclosure further provides a scan driving circuit, comprising the shift register unit according to any one of the above-mentioned embodiments.

At least one embodiment of the present disclosure further provides an array substrate, comprising the shift register unit according to any one of the above-mentioned embodiments or the scan driving circuit according to any one of the above-mentioned embodiments.

At least one embodiment of the present disclosure further provides a display device, comprising the shift register unit according to any one of the above-mentioned embodiments, the scan driving circuit according to any one of the above-mentioned embodiments or the array substrate according to any one of the above-mentioned embodiments.

At least one embodiment of the present disclosure further provides a method of driving a shift register unit, the shift register unit comprising an input terminal, a reset terminal and an output terminal, and the driving method comprising: setting a first node to a valid level and setting a second node to an invalid-level in a case where the input terminal is at a valid level; setting the output terminal to a valid level by using a first clock signal in a case where the first node is at the valid level; setting the second node to a valid level and setting the input terminal to an invalid level in a case where the reset terminal is at a valid level; and setting the first node to an invalid level in a case where the second node is at the valid level.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

As a basic circuit unit of a gate driver adopting GOA technologies, a shift register unit may output a gate driving signal under the action of both an input terminal-received signal and a reset terminal-received signal. However, in the shift register unit, the input terminal-received signal may interfere an operation triggered by the reset terminal-received signal, even affect a normal operation of the shift register unit in the case where zero voltage switching occurs in a transistor.

At least one embodiment of the present disclosure provides a shift register unit and a driving method thereof, a scan driving circuit, an array substrate and a display device, which may suppress an interference with the reset terminal-received signal caused by the input terminal-received signal of the shift register unit. In this shift register unit, based on arrangements of a reset circuit, a first reset control circuit and a second reset control circuit, this shift register unit may avoid an influence of a signal at an input terminal on a second node during a period when the reset terminal is at a valid level while realizing reset control, thereby suppressing the interference with the reset terminal-received signal caused by the input terminal-received signal, contributing to a reduction of an output noise of the shift register unit, and improving reliability of products.

Figure 1:
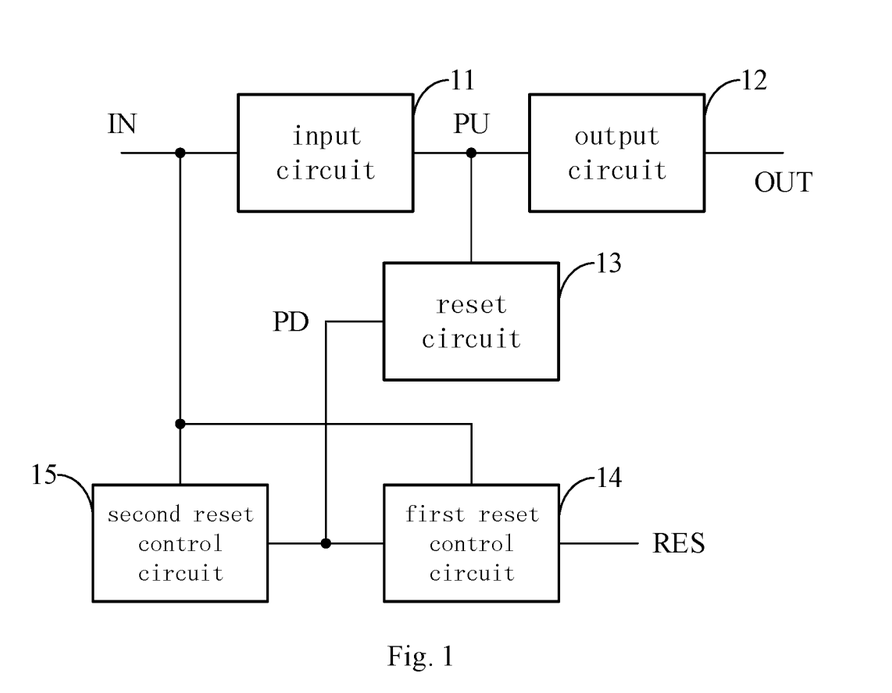
FIG. 1 is a structural block diagram of a shift register unit according to an embodiment of the present disclosure.

FIG. 1 is a structural block diagram of a shift register unit according to an embodiment of the present disclosure. Referring to FIG. 1, the shift register unit includes an input terminal IN, a reset terminal RES and an output terminal OUT, and further includes: an input circuit 11 connected with the input terminal IN and a first node PU respectively, and configured for setting the first node PU to a valid level when the input terminal IN is at a valid level;

an output circuit 12 connected with the output terminal OUT and the first node PU respectively, and configured for setting the output terminal OUT to a valid level by using a first clock signal when the first node PU is at a valid level;

a reset circuit 13 connected with the first node PU and the second node PD respectively, and configured for setting the first node PU to an invalid level when the second node PD is at a valid level;

a first reset control circuit 14 connected with the second node PD, the input terminal IN and the reset terminal RES respectively, and configured for setting the second node PD to a valid level and setting the input terminal IN to an invalid level when the reset terminal RES is at a valid level; and a second reset control circuit 15 connected with the second node PD and the input terminal IN respectively, and configured for setting the second node PU to an invalid level when the input terminal IN is at a valid level.

It should be noted that the valid level and the invalid level herein refer to two different pre-configured voltage ranges (both based on a common terminal voltage) with respect to a specific circuit node respectively. In one example, the valid levels of all the circuit nodes are high levels in a digital circuit. In another example, the valid levels of all the circuit nodes are low levels in a digital circuit. In yet another example, the valid levels at the input terminal IN and the reset terminal RES are low levels in the digital circuit, while the valid levels at the output terminal OUT, the first node PU and the second node PD are high levels in the digital circuit. Certainly, the way of arranging the valid levels and invalid levels may not be limited to the above-mentioned examples.

For example, the process of setting the second node PD to a valid level may be performed by the first reset control circuit 14 when the reset terminal RES is at a valid level, an at the same time, the first reset control circuit 14 further sets the input terminal IN to an invalid level, i.e., a noise voltage at the input terminal IN may be released to a circuit node that provides the invalid level. Thus, the noise voltage at the input terminal IN would not affect the level at the second node PD, such that the first node PU is set to an invalid level smoothly, which avoids the abnormity that the output terminal OUT cannot return to the invalid level.

It shows that based on arrangements of the reset circuit 13, the first reset control circuit 14 and the second reset control circuit 15, the shift register unit according to the embodiments of the present disclosure may avoid an influence of a signal at the input terminal IN on the second node PD during a period when the reset terminal RES is at the valid level while realizing reset control, thereby suppressing the interference with the reset terminal RES-received signal caused by the input terminal IN-received signal, contributing to a reduction of an output noise of the shift register unit, and improving reliability of products.

Figure 2:
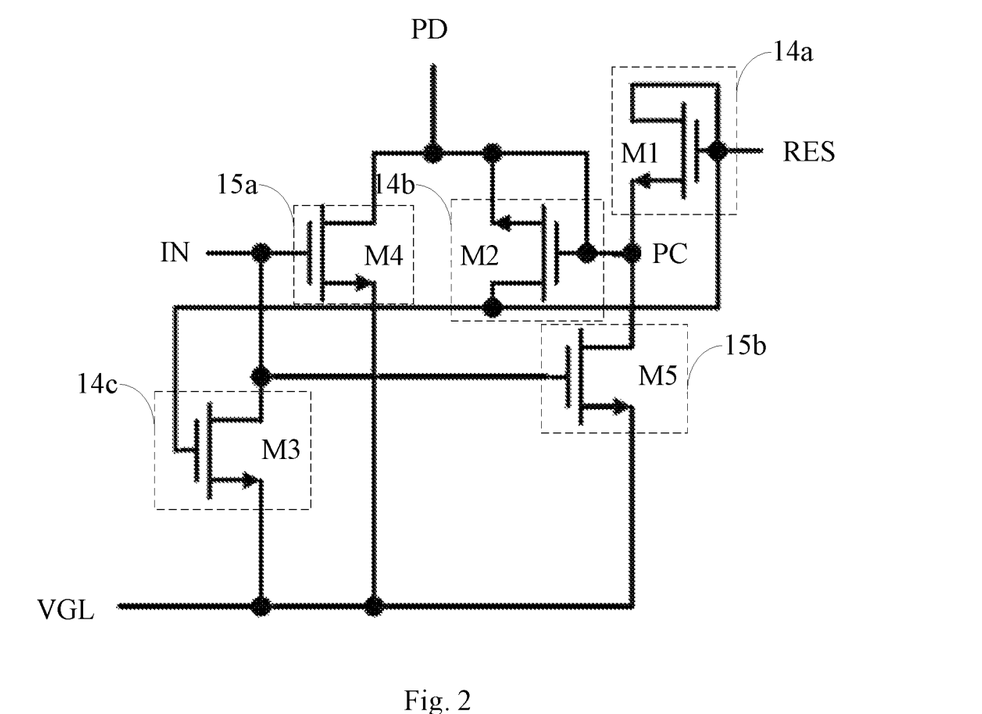
FIG. 2 is a local circuit structural diagram of a shift register unit according to another embodiment of the present disclosure.

FIG. 2 is a local circuit structural diagram of a shift register unit according to another embodiment of the present disclosure, which shows one exemplary circuit structure of the first reset control circuit and the second reset control circuit in the shift register unit. Referring to FIG. 2, the first reset control circuit 14 according to the present embodiment includes a first conduction subcircuit 14a, a second conduction subcircuit 14b and a reset subcircuit 14c.

For example, the first conduction subcircuit 14a is connected with the reset terminal RES and a third node PC respectively, and configured for conducting electricity between the reset terminal RES and the third node PC when the reset terminal RES is at a valid level. In FIG. 2, the first conduction subcircuit 14a takes the structure including a first transistor M1 as an example. A gate of the first transistor M1 is connected with the reset terminal RES, one of a source and a drain is connected with the reset terminal RES, and the other of the source and the drain is connected with the third node PC, thereby forming a conduction relation between the reset terminal RES and the third node PC using a source-drain current when the reset terminal RES is at a high level which is used as a valid level. It should be noted that connection relationships of the source and the drain may be set respectively according to the particular type of the transistor, so as to match with a direction of a current flowing through the transistor; when the transistor has symmetrical source and drain, the source and the drain may be treated as two electrodes without special distinction.

The second conduction subcircuit 14b is connected with the third node PC, the reset terminal RES and the second node PC respectively, and configured for conducting electricity between the reset terminal RES and the second node PD when the third node PC is provided with the valid level at the reset terminal RES. In FIG. 2, the second conduction subcircuit 14b takes the structure including a second transistor M2 as an example. A gate of the second transistor M2 is connected with the third node PC, one of the source and the drain is connected with the reset terminal RES, and the other of the source and the drain is connected with the second node PD, thereby forming a conduction relation between the reset terminal RES and the second node PD using a source-drain current when the third node PC is at a high level which is used as a valid level.

The reset subcircuit 14c is connected with the reset terminal RES and the input terminal IN respectively, and configured for setting the input terminal IN to an invalid level when the reset terminal RES is at a valid level. In FIG. 2, the reset subcircuit 14c takes the structure including a third transistor M3 as an example. A gate of the third transistor M3 is connected with the reset terminal RES, one of the source and the drain is connected with the input terminal IN, and the other of the source and the drain is connected with an invalid-level voltage line VGL (low-level voltage line), thereby pulling down the input terminal IN to a low level by using the source-drain current flowing from the input terminal IN to the invalid-level voltage line VGL when the reset terminal RES is at a high level which is used as a valid level.

In addition, as shown in FIG. 2, the second reset control circuit 15 includes a first part 15a and a second part 15b, and is further connected with the third node PC, besides the connection with the second node PD and the input terminal IN. In the present embodiment, the second reset control circuit 15 is not only configured to set the second node PD to an invalid level when the input terminal IN is at a valid level, but also to set the third node PC to the invalid level at the reset terminal RES when the input terminal IN is at a valid level. In FIG. 2, the first part 15a of the second reset control circuit 15 takes the structure including a fourth transistor M4 as an example. A gate of the fourth transistor M4 is connected with the input terminal IN, one of the source and the drain is connected with the second node PD, and the other of the source and the drain is connected with the invalid-level voltage line VGL, thereby pulling down the second node PD to a low level, which is used as the invalid level, by using the source-drain current flowing from the second node PD to the invalid-level voltage line VGL when the input terminal IN is at a high level which is used as the valid level. In FIG. 2, the second part 15b of the second reset control circuit 15 takes the structure including a fifth transistor M5 as an example. A gate of the fifth transistor M5 is connected with the input terminal IN, one of the source and the drain is connected with the third node PC, and the other of the source and the drain is connected with the invalid-level voltage line VGL, thereby pulling down the third node PC to a low level, which is used as the invalid level, by using the source-drain current flowing from the third node PC to the invalid-level voltage line VGL when the input terminal IN is at a high level which is used as the valid level.

In the present embodiment, the second node PD is connected with the third node PC, i.e., the level of the second node PD keeps consistent with the level of the third node PC. Based on this, during a period when the input terminal IN is at the valid level and the reset terminal RES is at the invalid level, the second node PD and the third node PC would be set to the invalid level by the first part 15a and the second part 15b of the second reset control circuit 15, while the first transistor M1 having a diode-connection mode may release the noise voltage at the reset terminal RES onto the invalid-level voltage line VGL through the source-drain current of the first transistor M1 and the fifth transistor M5. During a subsequent period when the input terminal IN is at the invalid level and the reset terminal RES is at the valid level, under the action of the first conduction subcircuit 14a and the second conduction subcircuit 14b, the second node PD and the third node PC may be set to the valid level, while the reset subcircuit 14c may release the noise voltage at the input terminal IN onto the invalid-level voltage line VGL. Thus, the interference between the input terminal IN and the reset terminal RES may be avoided.

In another example, the second node PD is disconnected with the third node PC, i.e., the level of the second node PD is independent of the level of the third node. Based on this, during a period when the input terminal IN is at the valid level and the reset terminal RES is at the invalid level, the second node PD would be set to the invalid level by the first part 15a of the second reset control circuit 15, and the third node PC would be set to the invalid level by the second part 15b of the second reset control circuit 15, while the first transistor M1 having a diode-connection mode in FIG. 2 may release the noise voltages at the reset terminal RES and at the third node PC onto the invalid-level voltage line VGL through the source-drain current of the first transistor M1 and the fifth transistor M5. During a subsequent period when the input terminal IN is at the invalid level and the reset terminal RES is at the valid level, under the action of the first conduction subcircuit 14a, the third node PC is set to the valid level, and under the action of the second conduction subcircuit 14b, the second node PD is set to the valid level, while the reset subcircuit 14c may release the noise voltage at the input terminal IN onto the invalid-level voltage line VGL. Thus, the interference between the input terminal IN and the reset terminal RES may be avoided.

It shows that no matter whether the second node PD is connected with the third node PC, the mutual interference between the input terminal IN and the reset terminal RES may be avoided. When the second node PD is not connected with the third node PC, the high-level voltage on the second node PD would not be released to the reset terminal RES by the second transistor M2 having a diode-connection mode, which prolongs the working time of the reset circuit 13, and further contributes to the maintenance of the stability of the level at the first node PD.

For example, the process of setting the second node PD to the invalid level may be performed by the second reset control circuit 15 when the input terminal IN is at the valid level, and at the same time, the second reset control circuit 15 further sets the third node PC to the invalid level, i.e., a noise voltage at the third node PC may be released at a circuit node that provides the invalid level. Thus, the noise voltage at the rest terminal RES would not affect the levels at the third node PC and the second node PD, such that the reset circuit 13 may stop setting the first node PU to the invalid level within the working time of the input circuit 11, which avoids the abnormality that the output terminal OUT cannot output the valid level due to the invalid level at the first node PU.

It shows that based on arrangements of the first conduction subcircuit 14a, the second conduction subcircuit 14b, the reset subcircuit 14c and the second reset control circuit 15, the shift register unit according to the embodiments of the present disclosure may avoid an influence of a signal at the reset terminal RES on a second node PD during a period when the input terminal IN is at a valid level while realizing reset control, thereby suppressing the interference with the input terminal IN-received signal caused by the reset terminal RES-received signal, contributing to a further reduction of an output noise of the shift register unit, and improving reliability of products.

Figure 3:
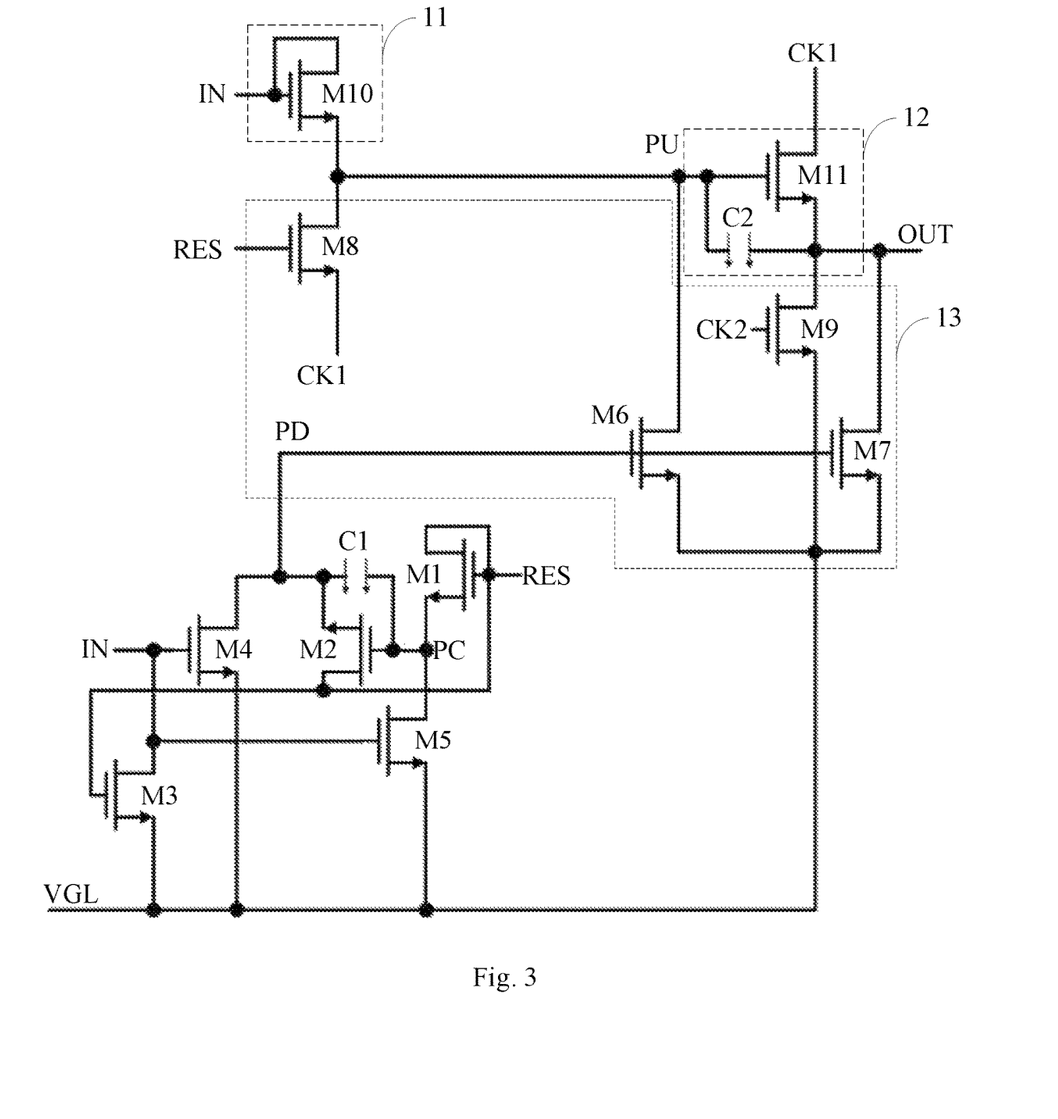
FIG. 3 is a circuit structural diagram of a shift register unit according to yet another embodiment of the present disclosure.

FIG. 3 is a circuit structural diagram of a shift register unit according to yet another embodiment of the present disclosure. Referring to FIG. 3, compared with the structure shown in FIG. 2, in the shift register unit according to the present embodiment, the first reset control circuit 14 is provided additionally with a first capacitor C1, and FIG. 3 further shows exemplary circuit structures of the input circuit 11, the output circuit 12 and the reset circuit 13.

Referring to FIG. 3, the input circuit 11 includes a tenth transistor M10, a gate of which is connected with the input terminal IN, one of the source and the drain of which is connected with the input terminal IN, and the other of the source and the drain of which is connected with the first node PU, thereby pulling up the first node PU to a high level, which is used as the valid level, using the source-drain current flowing from the input terminal IN to the first node PU when the input terminal IN is at a high level which is used as the valid level, and realizing the function of setting the first node PU to a valid level when the input terminal IN is at a valid level.

Referring to FIG. 3, the output circuit 12 includes an eleventh transistor M11 and a second capacitor C2. A gate of the eleventh transistor M11 is connected with the first node PU, one of the source and the drain is connected with a first clock signal line (or a first clock signal terminal) CK1, and the other of the source and the drain is connected with the output terminal OUT; a first terminal of the second capacitor C2 is connected with the first node PU, and a second terminal of the second capacitor C2 is connected with the output terminal OUT. For example, as an example of the present embodiment, one of a clock signal and an inverted clock signal may be loaded on a first clock signal line CK1 and a second clock signal line described below (or a second clock signal terminal) CK2 respectively (i.e., the signals of the first clock signal line CK1 and the second clock signal lines CK2 have opposite phases). As such, when the first node PU is at a high level, the eleventh transistor M11 is turned on under the action of the high level at the gate, thereby pulling up the output terminal OUT to a high level by using the high level on the first clock signal line CK1, and realizing the function of setting the output terminal OUT to a valid level by using the first clock signal when the first node PU is at a valid level. Certainly, the circuit structure of the output unit 12 may not be limited to the above.

Referring to FIG. 3, the reset circuit 13 includes a sixth transistor M6, a gate of which is connected with the second node PD, one of the source and the drain of which is connected with the first node PU, and the other of the source and the drain of which is connected with the invalid-level voltage line VGL, thereby pulling down the first node PU to a low level, which is used as the invalid level, by using the source-drain current flowing from the first node PU to the invalid-level voltage line VGL when the second node PD is at a high level which is used as the valid level, and realizing the function of setting the first node PU to an invalid level when the second node PD is at the valid level.

In FIG. 3, the reset circuit 13 further includes a seventh transistor M7, a gate of which is connected with the second node PD, one of the source and the drain of which is connected with the output terminal OUT, and the other of the source and the drain of which is connected with the invalid-level voltage line VGL, thereby pulling down the output terminal OUT to a low level, which is used as the invalid level, by using the source-drain current flowing from the output terminal OUT to the invalid-level voltage line VGL with a low level when the second node PD is at a high level which is used as the valid level, and resetting the output terminal OUT.

In FIG. 3, the reset circuit 13 further includes an eighth transistor M8, a gate of which is connected with the reset terminal RES, one of the source and the drain of which is connected with the first node PU, and the other of the source and the drain of which is connected with the first clock signal line CK1, thereby pulling down the first node PU to a low level, which is used as the invalid level, by using the source-drain current flowing from the first node PU to the first clock signal line CK1 with a low level when the reset terminal RES is at a high level which is used as the valid level, and resetting the first node PU.

In FIG. 3, the reset circuit 13 further includes a ninth transistor M9, a gate of which is connected with the second clock signal line CK2, one of the source and the drain of which is connected with the output terminal OUT, and the other of the source and the drain of which is connected with the invalid-level voltage line VGL, thereby pulling down the output terminal OUT to a low level, which is used as the invalid level, by using the source-drain current flowing from the output terminal OUT to the invalid-level voltage line VGL when the second clock signal line CK2 is at a high level which is used as the valid level, and resetting the output terminal OUT, as well as releasing the noise voltage at the output terminal OUT periodically according to the clock signal of the second clock signal line CK2, and maintaining the stability of the signal at the output terminal OUT.

Figure 4:
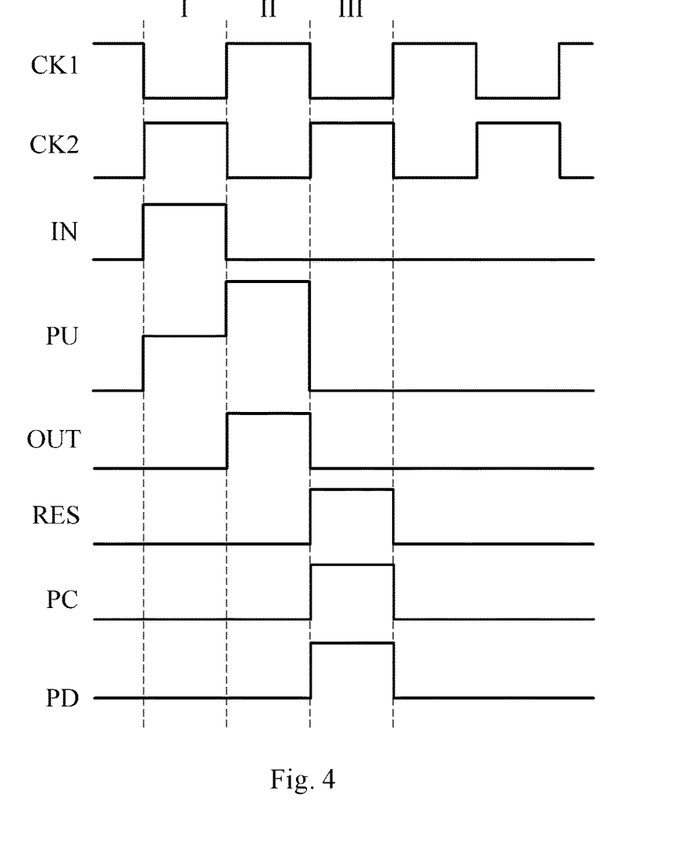
FIG. 4 is a circuit timing diagram of the shift register unit shown in FIG. 3.

FIG. 4 is a circuit timing diagram of the shift register unit shown in FIG. 3. Referring to FIG. 4, the working stage of the above-mentioned shift register unit mainly includes an input stage I, an output stage II and a reset stage III. Referring to FIGS. 3 and 4, the operation principle of the above-mentioned shift register unit is described below. It should be noted that in FIG. 4 and the following descriptions, CK1, CK2, IN, OUT, RES, etc. are not only used for representing corresponding signal terminals, but also corresponding signals. The same applies to the following embodiments, which will not be repeated.

In the input stage I, the input terminal IN is shifted to a high level, the fourth transistor M4, the fifth transistor M5 and the tenth transistor M10 are turned on, and the first node PU is pulled up to a high level, such that the eleventh transistor M11 is turned on, and the second node PD and the third node PC are pulled down to a low level. At this point, the first clock signal CK1 is at a low level, the second clock signal CK2 is at a high level, and the output terminal OUT is kept to a low level under a pull-down action of the ninth transistor M9 in the ON state. Thus, the first terminal of the second capacitor C2 is provided with the high level at the first node PU, and the second terminal is provided with the low level at the output terminal OUT. Also, the first terminal of the first capacitor C1 is provided with the low level at the second node PD, and the second terminal is provided with the low level at the third node PC.

In the output stage II, the input terminal IN is shifted to a low level, and the first clock signal CK1 is shifted to a high level. Under the action of charge retention of the second capacitor C2, the first node PU would jump to the high level higher than a potential with a change of the first clock signal CK1 from a low level to a high level, such that the eleventh transistor M11 is entirely turned on, and the potential at the output terminal OUT is rapidly pulled up, i.e., the output terminal OUT outputs a gate driving signal.

In the reset stage III, the reset terminal RES is shifted to a high level, the first clock signal CK1 is shifted to a low level, the second clock signal CK2 is shifted to a high level, and the first transistor M1, the third transistor M3, the seventh transistor M7, the eighth transistor M8 and the ninth transistor M9 are turned on. The potential at the third node PC rises gradually with an injection of the source-drain current of the first transistor M1. Before the potential at the third node PC rises to such value that the second transistor M2 is turned on, the second transistor M2 is not turned on, so the potential at the second node PD rises with a rise in potential of the third node PC under the action of charge retention of the first capacitor C1. After the second transistor M2 is turned on, the potential at the second node PD rapidly rises to the high level under the combined action of lifting of the first capacitor C1 and the source-drain current of the second transistor M2, such that the sixth transistor M6 and the seventh transistor M7 are turned on. During this procedure, the third transistor M3 keeps the input terminal IN at a low level, which avoids the influence of the noise at the input terminal IN on the above-mentioned procedure. Under the combined action of the sixth transistor M6 and the eighth transistor M8, the first node PU is pulled down to a low level; under the combined action of the seventh transistor M7 and the ninth transistor M9, the output terminal OUT is pulled down to a low level, thereby resetting the shift register unit.

Figure 5:
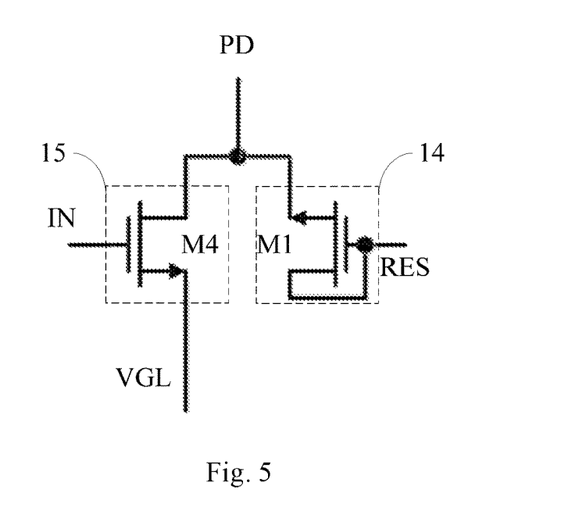
FIG. 5 is a local circuit structural diagram of a shift register unit.

In order to illustrate the advantageous effects of the embodiments of the present disclosure more clearly, FIG. 5 is a local circuit structural diagram of the shift register unit. Referring to FIG. 5, in the shift register unit, based on the circuit shown in FIG. 3, the second reset control circuit 15 is configured as a circuit structure including only the above-mentioned fourth transistor M4, and the first reset control circuit 14 is configured as the first transistor M1, the gate and the drain of which are connected with the reset terminal RES and the source of which is connected with the second node PD. Based on this, in the above-mentioned input stage I, the noise voltage at the reset terminal RES may tend to turn on the sixth transistor M6 unintentionally by the pull-up action of the first transistor Ml on the potential at the second node PD, such that the first node PU cannot be pulled up to a high level, which leads to the result that the output terminal OUT cannot output a high level in the output stage II and abnormal output occurs. Also, in the above-mentioned reset stage III, the noise voltage at the input terminal IN may tend to prevent the second node PD from being at a high level by the pull-down action of the fourth transistor M4 on the potential at the second node PD, which leads to the result that the first node PU is not pulled down completely, and false output at the output terminal is caused after the reset stage III.

The comparison of implementations shown in FIGS. 3 and 4 with the shift register unit shown in FIG. 5 shows that the noise voltages at the input terminal IN and the reset terminal RES according to the embodiments of the present disclosure may be suppressed, thereby greatly reducing the possibility of occurrence of the above-mentioned abnormity. That is, based on the above-mentioned arrangements of the first reset control circuit 14 including the first conduction subcircuit 14a, the second conduction subcircuit 14b and the reset subcircuit 14c and the second reset control circuit 15, the shift register unit according to the embodiments of the present disclosure may reduce the mutual interference between the input terminal IN and the reset terminal RES while realizing reset control, thereby contributing to the further reduction of the output noise of the shift register unit, and improving the reliability of products.

It should be noted that in the explanation of each embodiment of the present disclosure, the first node PU, the second node PD and the third node PC are not subsistent parts, but junctions of related electric connections in the circuit diagram.

It should be noted that as the transistor used in the embodiments of the present disclosure, a thin film transistor, a field effect transistor or a switch device with same properties may be used, and the embodiments of the present disclosure will be explained by taking the thin film transistor as an example. Due to the symmetrical structure, the source and the drain of the transistor used herein may not be different structurally. In the embodiments of the present disclosure, in order to distinguish the drain from the source of the transistor, one of the drain and the source is referred to as a first electrode, and the other is referred to as a second electrode.

It should be noted that the transistors shown in FIG. 3 are all N-type transistors, i.e., it may be formed by the same manufacture process to reduce the manufacture costs. When the N-type transistor is used, IGZO (Indium Gallium Zinc Oxide) may be taken as an active layer of the thin film transistor. Compared with the adoption of LTPS (Low Temperature Poly Silicon) or A-Si (for example, a-SiH) as the active layer of the thin film transistor, the size of the transistor may be reduced effectively and a leakage current is prevented. For the sake of understanding, in the embodiments of the present disclosure, all transistors are N-type transistors, and descriptions are made by taking a high level as a valid level and a low level as an invalid level. At this point, the first electrode of the transistor is the drain and the second electrode is the source. Certainly, the embodiments of the present disclosure include but are not limited thereto. For example, in practice, the low level may also be taken as the valid level, the high level be taken as the invalid level, and/or part or all of the N-type transistors are replaced with P-type transistors. At this point, the first electrode of the transistor is the source, and the second electrode is the drain. The electrodes of selected transistors are connected correspondingly with reference to the electrodes of corresponding transistors in the embodiments of the present disclosure, and the corresponding voltage terminals provide the corresponding high voltage or low voltage. For example, based on the embodiments of the present disclosure, the following changes are made. All transistors in FIG. 3 are P-type transistors, and the high level and the low level of related signals are interchanged, for example, the invalid-level voltage line VGL outputs a high level instead of a low level. It is easily understood that such changes would cause interchanges of high level and low level, as well as potential pulling up and pulling down in operation principle of the circuit, without changing the operation principle of the circuit in essence. Therefore, the changed circuit structure, the circuit timing and the operation principle of the circuit may be understood with reference to the above-mentioned embodiments, and are not repeated herein.

In the embodiments of the present disclosure, for example, when each circuit is embodied as an N-type transistor, the term "pulling up" refers to charging one node or one electrode of one transistor, such that this node or this electrode has an absolute value–increased level, thereby operating the corresponding transistor (for example, turning on); "pulling down" refers to discharging one node or one electrode of one transistor, such that this node or this electrode has an absolute value-reduced level, thereby operating the corresponding transistor (for example, turning off). For another example, when each circuit is embodied as an P-type transistor, the term "pulling up" refers to discharging one node or one electrode of one transistor, such that this node or this electrode has an absolute value-reduced level, thereby operating the corresponding transistor (for example, turning on); "pulling down" refers to charging one node or one electrode of one transistor, such that this node or this electrode has an absolute value-increased level, thereby operating the corresponding transistor (for example, turning off).

It should be noted that the embodiments shown in FIGS. 3 and 4 are only exemplary, and may be varied as required in specific application scenarios, without departing from technical concept of the embodiments of the present disclosure. For example, in one example, the source of the above-mentioned eighth transistor M8 may be connected with the invalid-level voltage line VGL, without changing the function and action of the eighth transistor M8. For another example, in another example, the source of the ninth transistor M9 may be connected with the reset terminal RES, such that the ninth transistor M9 would not introduce the noise on the second clock signal CK2 onto the output terminal OUT.

In addition, the first capacitor C1 is configured as follows. As shown in FIG. 3, the first terminal of the first capacitor C1 is connected with the second node PD, and the second terminal of the first capacitor C1 is connected with the third node PC. Based on the arrangement of the first capacitor C1, from the timing when the reset terminal RES is shifted to a high level from a low level, the potential at the third node PC rises increasingly with an injection of the source-drain current of the first transistor M1. Before the potential at the third node PC rises to such value that the second transistor M2 is turned on, the second transistor M2 is not turned on, so the potential at the second node PD rises with the rise in potential of the third node PC under the action of charge retention of the first capacitor C1. Compared with the situation where no first capacitor C1 is arranged, just when the second transistor M2 is turned on, the potential at the second node PD is lifted, such that the second node PD rises to the high level more rapidly, and the sixth transistor M6 and the seventh transistor M7 are turned on more rapidly, which accelerates the reset of the first node PU and the output terminal OUT at the start of the reset stage III.

Based on the same concept, another embodiment of the present disclosure provides a scan driving circuit, including several stages of the shift register units according to any one of the above-mentioned embodiments. Based on the advantageous effects obtained by the shift register units, this scan driving circuit may also obtain the same or corresponding advantageous effects.

Figure 6:
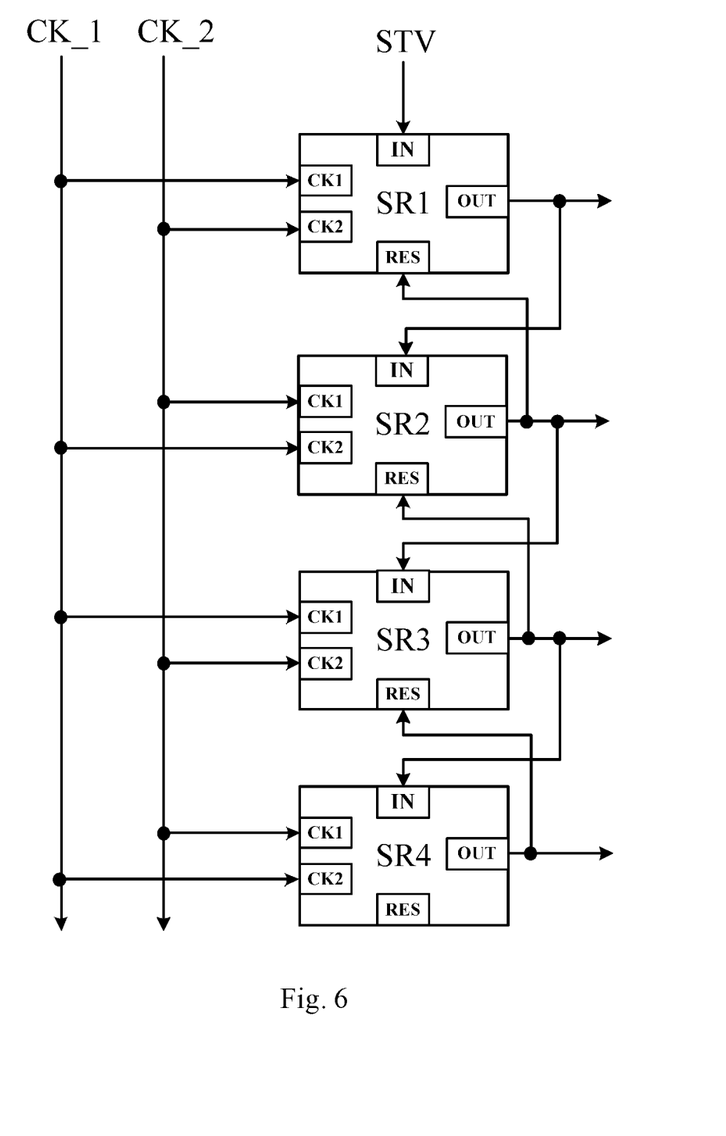
FIG. 6 is a schematic block diagram of a scan driving circuit according to an embodiment of the present disclosure.

FIG. 6 is a schematic block diagram of a scan driving circuit according to an embodiment of the present disclosure; For example, as shown in FIG. 6, in this scan driving circuit (gate driving circuit), except for the shift register unit at the first stage, the input terminal IN of the shift register unit at any stage is connected with the output terminal OUT of the shift register unit at the former stage; except for the shift register unit at the first stage, the output terminal OUT of the shift register unit at any stage is connected with the reset terminal RES of the shift register unit at the former stage. For example, the input terminal IN of the shift register unit at the first stage is connected with a trigger signal STV, and the reset terminal RES of the shift register unit at the last stage is connected with the reset line which is provided additionally. Also, in order to realize correct signal timing, the first clock signal terminal CK1 of the shift register unit at each odd-numbered stage and the second clock signal terminal CK2 of the shift register unit at each even-numbered stage are connected to the same first system clock line CK_1, and the second clock signal terminal CK2 of the shift register unit at each odd-numbered stage and the first clock signal terminal CK1 of the shift register unit at each even-numbered stage are connected to the same second system clock line CK_2. That is, except for the first stage, the connection of the clock signal of the shift register unit at any stage is opposite to that of the shift register unit at the former stage. The work principle of this scan driving circuit is similar to that of the shift register unit according to the above-mentioned embodiments, and is not repeated herein.

Based on the same concept, yet another embodiment of the present disclosure provides an array substrate, including any one of the above-mentioned shift register units or at least one of any one of the above-mentioned scan driving circuits. Based on the advantageous effects obtained by the shift register unit or the scan driving circuit, this array substrate may also obtain the same or corresponding advantageous effects.

Figure 7:
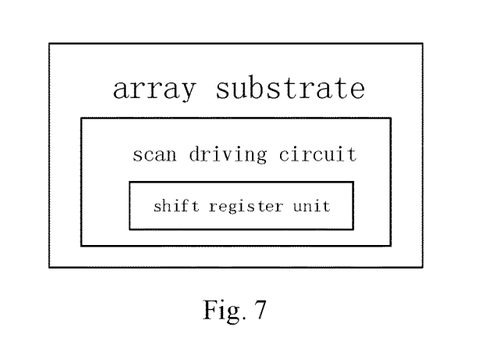
FIG. 7 is a schematic block diagram of an array substrate according to an embodiment of the present disclosure.

FIG. 7 is a schematic block diagram of an array substrate according to an embodiment of the present disclosure. As shown in FIG. 7, this array substrate includes the shift register unit according to any one of the above-mentioned embodiments or the scan driving circuit according to any one of the above-mentioned embodiments. For example, when the scan driving circuit is used to drive the array substrate, the scan driving circuit may be arranged at one side of the array substrate outside a display area. For example, this array substrate includes a plurality of rows of gate lines, and the output terminal OUT of the shift register unit of each stage in the scan driving circuit may be configured to be connected to the plurality of rows of gate lines in sequence to output the scan driving signal. For example, in one example, the array substrate is provided with several (for example, 2) scan driving circuits according to any one of the above-mentioned embodiments outside the display area, and the two scan driving circuits are arranged at two sides of the array substrate respectively, for implementing double-side driving. For example, one scan driving circuit may be arranged at one side of the array substrate to drive odd numbered rows of gate lines, and another scan driving circuit is arranged at the other side of the array substrate to drive even numbered rows of gate lines.

Based on the same concept, yet another embodiment of the present disclosure provides a display device, including any one of the above-mentioned shift register units, any one of the above-mentioned scan driving circuits or any one of the above-mentioned array substrate. Based on the advantageous effects obtained by the shift register unit, the scan driving circuit or the array substrate, the display device may also obtain the same or corresponding advantageous effects.

Figure 8:
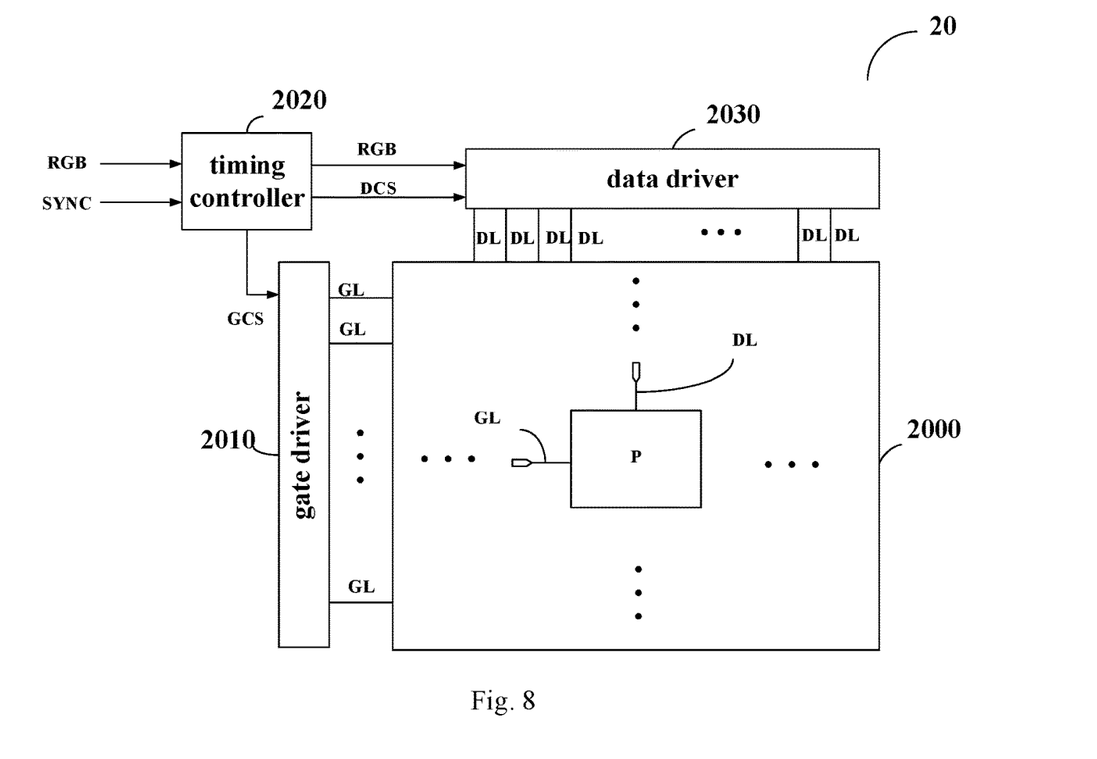
FIG. 8 is a schematic block diagram of a display device according to an embodiment of the present disclosure.

FIG. 8 is a schematic block diagram of a display device according to an embodiment of the present disclosure. As shown in FIG. 8, the display device 20 includes a display panel 2000, a gate driver 2010, a timing controller 2020 and a data driver 2030. The display panel 2000 includes a plurality of pixel units P which are defined by intersecting scan lines GL and data lines DL; the gate driver 2010 is used for driving the scan lines GL; the data driver 2030 is used for driving the data lines DL; the timing controller 2020 is used for processing image data RGB input from outside of the display device 20, providing the processed image data RGB to the data driver 2030 and outputting a scan control signal GCS and a data control signal DCS to the gate driver 2010 and the data driver 2030, so as to control the gate driver 2010 and the data driver 2030.

For example, the gate driver 2010 includes the shift register unit or the scan driving circuit according to any one of the above-mentioned embodiments. For another example, the display panel 2000 includes the array substrate according to any one of the above-mentioned embodiments. The output terminals OUT of the plural shift register units in the scan driving circuit are connected with the scan lines GL correspondingly. The scan lines GL are connected with the pixel units P arranged in rows correspondingly. The output terminals OUT of the shift register unit of each stage in the scan driving circuit output signals to the scan lines GL in sequence, so as to make the plurality of rows of pixel units P in the display panel 2000 implement progressive scanning. For example, the gate driver 2010 may be implemented as a semiconductor chip, or may be integrated in the display panel 2000, to form a GOA circuit.

For example, the data driver 2030 converts the digital image data RGB input from the timing controller 2020 into a data signal by using a reference gamma voltage according to a plurality of data control signals DCS from the timing controller 2020. The data driver 2030 provides the converted data signal to the data lines DL. For example, the data driver 2030 may be implemented as the semiconductor chip.

For example, the timing controller 2020 processes the image data RGB input externally, to match the size and resolution of the display panel 2000, and then provides the processed image data to the data driver 2030. The timing controller 2020 generates a plurality of scan control signals GCS and a plurality of data control signals DCS by using a synchronization signal input from the outside of the display device 20 (for example, dot clock DCLK, data enable signal DF, horizontal synchronization signal Hsync and vertical synchronization signal Vsync). The timing controller 2020 provides the generated scan control signals GCS and data control signals DCS to the gate driver 2010 and the data driver 2030 respectively, so as to control the gate driver 2010 and the data driver 2030.

The display device 20 may further include other components, for example, a signal decoding circuit, a voltage converting circuit, or the like, all of these components may be existing conventional parts, and will not be described in detail herein.

For example, the display device 20 may be any product or part with a display function, such as a liquid crystal display (LCD) panel, an LCD TV, a display, an OLED (Organic Light-Emitting Diode) panel, an OLED TV, an electronic paper display device, a mobile phone, a tablet PC, a laptop, a digital photo frame, a navigator, or the like, and is not limited thereto. The technical effects of the display device 20 may refer to the corresponding descriptions of the shift register unit according to the above-mentioned embodiments, and are not repeated herein.

Figure 9:
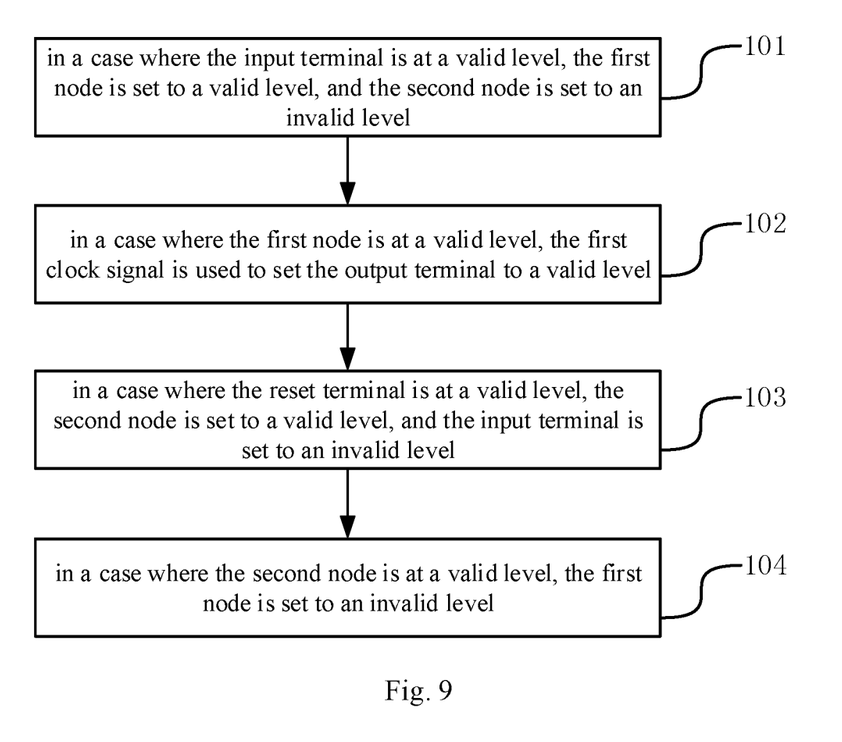
FIG. 9 is a flow chart of a method of driving a shift register unit according to an embodiment of the present disclosure.

Based on the same concept, yet another embodiment of the present disclosure provides a method of driving a shift register unit which has an input terminal, a reset terminal and an output terminal. Referring to FIG. 9, the driving method includes the following steps.

In step 101: in a case where the input terminal is at a valid level, the first node is set to a valid level, and the second node is set to an invalid level.

In step 102: in a case where the first node is at the valid level, the output terminal is set to a valid level by using the first clock signal.

In step 103: in a case where the reset terminal is at a valid level, the second node is set to a valid level, and the input terminal is set to an invalid level.

In step 104: in a case where the second node is at the valid level, the first node is set to an invalid level.

It should be noted that the operation process of any one of the above-mentioned shift register units may be taken as an example of the implementation of the above-mentioned driving method, so the particular process of each above-mentioned step may refer to the foregoing descriptions, and is not repeated herein.

It shows that the method of driving a shift register unit according to the present disclosure may avoid an influence of a signal at an input terminal IN on a second node PD during a period when the reset terminal is at a valid level, while realizing reset control, thereby suppressing the interference with the reset terminal-received signal caused by the input terminal-received signal, contributing to a reduction of an output noise of the shift register unit, and improving reliability of products.

What are described above is related to the illustrative embodiments of the disclosure only and not limitative to the scope of the disclosure; the scopes of the disclosure are defined by the accompanying claims.

What is claimed is:

1. A shift register unit, comprising an input terminal, an output terminal and a reset terminal, and further comprising:
    an input circuit, the input circuit being connected with the input terminal and a first node respectively, and the input circuit being configured for setting the first node to a valid level in a case where the input terminal is at a valid level;
    an output circuit, the output circuit being connected with the output terminal and the first node respectively, and the output circuit being configured for setting the output terminal to a valid level by using a first clock signal in a case where the first node is at the valid level;
    a reset circuit, the reset circuit being connected with the first node and the second node respectively, and the reset circuit being configured for setting the first node to an invalid level in a case where the second node is at a valid level;
    a first reset control circuit, the first reset control circuit being connected with the second node, the input terminal and the reset terminal respectively, and the first reset control circuit being configured for setting the second node to the valid level and setting the input terminal to an invalid level in a case where the reset terminal is at a valid level; and
    a second reset control circuit, the second reset control circuit being connected with the second node and the input terminal respectively, and the second reset control circuit being configured for setting the second node to an invalid level in a case where the input terminal is at the valid level.

2. The shift register unit according to claim 1, wherein the first reset control circuit comprises:
    a first conduction subcircuit, the first conduction subcircuit being connected with the reset terminal and a third node respectively, and the first conduction subcircuit being configured for conducting electricity between the reset terminal and the third node in a case where the reset terminal is at the valid level;
    a second conduction subcircuit, the second conduction subcircuit being connected with the third node, the reset terminal and the second node respectively, and the second conduction subcircuit being configured for conducting electricity between the reset terminal and the second node in a case where the third node is provided with the valid level at the reset terminal; and
    a reset subcircuit, the reset subcircuit being connected with the reset terminal and the input terminal respectively, and the reset subcircuit being configured for setting the input terminal to an invalid level in a case where the reset terminal is at the valid level;
    correspondingly, the second reset control circuit is further connected with the third node, and configured for setting the third node to an invalid level in a case where the input terminal is at the valid level.

3. The shift register unit according to claim 2, wherein the first conduction subcircuit comprises a first transistor, the second conduction subcircuit comprises a second transistor, and the reset subcircuit comprises a third transistor;
    a gate of the first transistor is connected with the reset terminal, one of a source and a drain of the first transistor is connected with the reset terminal, and a remaining one of the source and the drain of the first transistor is connected with the third node;
    a gate of the second transistor is connected with the third node, one of a source and a drain of the second transistor is connected with the reset terminal, and a remaining one of the source and the drain of the second transistor is connected with the second node;
    a gate of the third transistor is connected with the reset terminal, one of a source and a drain of the third transistor is connected with the input terminal, and a remaining one of the source and the drain of the third transistor is connected with an invalid-level voltage line.

4. The shift register unit according to claim 3, wherein the first reset control circuit further comprises a first capacitor, a first terminal of the first capacitor is connected with the second node, and a second terminal of the first capacitor is connected with the third node.

5. The shift register unit according to claim 3, wherein the third node is connected with the second node.

6. The shift register unit according to claim 3, wherein the second reset control circuit comprises a fourth transistor and a fifth transistor;
   a gate of the fourth transistor is connected with the input terminal, one of a source and a drain of the fourth transistor is connected with the second node, a remaining one of the source and the drain of the fourth transistor is connected with the invalid-level voltage line;
   a gate of the fifth transistor is connected with the input terminal, one of a source and a drain of the fifth transistor is connected with the third node, a remaining one of the source and the drain of the fifth transistor is connected with the invalid-level voltage line.

7. The shift register unit according to claim 2, wherein the first reset control circuit further comprises a first capacitor,
   a first terminal of the first capacitor is connected with the second node, and a second terminal of the first capacitor is connected with the third node.

8. The shift register unit according to claim 7, wherein the second reset control circuit comprises a fourth transistor and a fifth transistor;
   a gate of the fourth transistor is connected with the input terminal, one of a source and a drain of the fourth transistor is connected with the second node, a remaining one of the source and the drain of the fourth transistor is connected with an invalid-level voltage line;
   a gate of the fifth transistor is connected with the input terminal, one of a source and a drain of the fifth transistor is connected with the third node, a remaining one of the source and the drain of the fifth transistor is connected with the invalid-level voltage line.

9. The shift register unit according to claim 2, wherein the third node is connected with the second node.

10. The shift register unit according to claim 2, wherein the second reset control circuit comprises a fourth transistor and a fifth transistor;
    a gate of the fourth transistor is connected with the input terminal, one of a source and a drain of the fourth transistor is connected with the second node, a remaining one of the source and the drain of the fourth transistor is connected with an invalid-level voltage line;
    a gate of the fifth transistor is connected with the input terminal, one of a source and a drain of the fifth transistor is connected with the third node, a remaining one of the source and the drain of the fifth transistor is connected with the invalid-level voltage line.

11. The shift register unit according to claim 1, wherein the reset circuit comprises a sixth transistor;
    a gate of the sixth transistor is connected with the second node, one of a source and a drain of the sixth transistor is connected with the first node, a remaining one of the source and the drain of the sixth transistor is connected with an invalid-level voltage line.

12. The shift register unit according to claim 1, wherein the reset circuit further comprises a seventh transistor,
    a gate of the seventh transistor is connected with the second node, one of a source and a drain of the seventh transistor is connected with the output terminal, a remaining one of the source and the drain of the seventh transistor is connected with an invalid-level voltage line.

13. The shift register unit according to claim 1, wherein the reset circuit further comprises an eighth transistor,
    a gate of the eighth transistor is connected with the reset terminal, one of a source and a drain of the eighth transistor is connected with the first node, a remaining one of the source and the drain of the eighth transistor is connected with a first clock signal or an invalid-level voltage line.

14. The shift register unit according to claim 1, wherein the reset circuit further comprises a ninth transistor,
    a gate of the ninth transistor is connected with the reset terminal or the second clock signal, one of a source and a drain of the ninth transistor is connected with the output terminal, a remaining one of the source and the drain of the ninth transistor is connected with an invalid-level voltage line;
    the first clock signal and the second clock signal have opposite phases.

15. The shift register unit according to claim 1, wherein the input circuit comprises a tenth transistor,
    a gate of the tenth transistor is connected with the input terminal, one of a source and a drain of the tenth transistor is connected with the input terminal, a remaining one of the source and the drain of the tenth transistor is connected with the first node.

16. The shift register unit according to claim 1, wherein the output circuit comprises an eleventh transistor and a second capacitor;
    a gate of the eleventh transistor is connected with the first node, one of a source and a drain of the eleventh transistor is connected with the first clock signal, a remaining one of the source and the drain of the eleventh transistor is connected with the output terminal;
    a first terminal of the second capacitor is connected with the first node, and a second terminal of the second capacitor is connected with the output terminal.

17. A scan driving circuit, comprising the shift register unit according to claim 1.

18. An array substrate, comprising the shift register unit according to claim 1.

19. A display device, comprising the shift register unit according to claim 1.

20. A method of driving a shift register unit, the shift register unit comprising an input terminal, a reset terminal and an output terminal, and further comprising:
    an input circuit, the input circuit being connected with the input terminal and a first node respectively, and the input circuit being configured for setting the first node to a valid level in a case where the input terminal is at a valid level;
    an output circuit, the output circuit being connected with the output terminal and the first node respectively, and the output circuit being configured for setting the output terminal to a valid level by using a first clock signal in a case where the first node is at the valid level;
    a reset circuit, the reset circuit being connected with the first node and the second node respectively, and the reset circuit being configured for setting the first node to an invalid level in a case where the second node is at a valid level;
    a first reset control circuit, the first reset control circuit being connected with the second node, the input terminal and the reset terminal respectively, and the first reset control circuit being configured for setting the second node to the valid level and setting the input terminal to an invalid level in a case where the reset terminal is at a valid level; and a second reset control circuit, the second reset control circuit being connected with the second node and the input terminal respectively, and the second reset control circuit being configured for setting the second node to an invalid level in a case where the input terminal is at the valid level;

wherein the driving method comprises:

setting the first node to the valid level and setting the second node to the invalid level in a case where the input terminal is at the valid level;

setting the output terminal to the valid level by using the first clock signal in a case where the first node is at the valid level;

setting the second node to the valid level and setting the input terminal to the invalid level in a case where the reset terminal is at the valid level; and setting the first node to the invalid level in a case where the second node is at the valid level.

\* \* \* \* \*